(12) United States Patent
Ando et al.

(10) Patent No.: US 9,128,160 B2
(45) Date of Patent: Sep. 8, 2015

(54) BATTERY FUEL GAUGE CIRCUIT

(75) Inventors: Kimio Ando, Kyoto (JP); Shigekane Matsui, Kyoto (JP); Isao Yamamoto, Kyoto (JP)

(73) Assignee: ROHM CO., LTD. (JP)

( * ) Notice: Subject to any disclaimer, the term of this patent is extended or adjusted under 35 U.S.C. 154(b) by 813 days.

(21) Appl. No.: 13/365,748

(22) Filed: Feb. 3, 2012

(65) Prior Publication Data

US 2012/0203484 A1 Aug. 9, 2012

(30) Foreign Application Priority Data

Feb. 7, 2011 (JP) .................. 2011-024006

(51) Int. Cl.
| | | |
|---|---|---|
| H02J 7/00 | (2006.01) | |
| H04B 1/38 | (2006.01) | |
| G01R 31/36 | (2006.01) | |
| H01M 10/42 | (2006.01) | |
| H04W 52/02 | (2009.01) | |

(52) U.S. Cl.
CPC ... *G01R 31/3613* (2013.01); *H01M 2010/4278* (2013.01); *H04W 52/028* (2013.01)

(58) Field of Classification Search
CPC .................................. G01R 31/3613
USPC ................ 320/134, 135; 455/573, 574
See application file for complete search history.

(56) References Cited

U.S. PATENT DOCUMENTS

| | | | | |
|---|---|---|---|---|
| 5,606,242 | A * | 2/1997 | Hull et al. ............. | 320/106 |
| 5,729,589 | A * | 3/1998 | Samson ............. | 379/32.04 |
| 6,480,132 | B1 * | 11/2002 | Yoshioka et al. ....... | 341/155 |
| 6,686,860 | B2 * | 2/2004 | Gulati et al. ............. | 341/155 |
| 2009/0027056 | A1 * | 1/2009 | Huang et al. ........... | 324/439 |

* cited by examiner

*Primary Examiner* — Richard Isla Rodas
*Assistant Examiner* — David V Henze-Gongola
(74) *Attorney, Agent, or Firm* — Cantor Colburn LLP

(57) ABSTRACT

A detection circuit is mounted on an electronic device having a communication function, including at least a battery, a CPU, and a communication unit, and is configured to detect the remaining battery charge. An A/D converter performs sampling of a magnitude of a current $I_{BAT}$ discharged from the battery, and converts the current $I_{BAT}$ thus sampled into a digital current value. An interface circuit receives, from the CPU, control data which indicates a period in which there is an increase in the current discharged from the battery. Based upon the control data, a control unit raises the sampling frequency of the A/D converter in the period in which there is an increase in the current $I_{BAT}$.

9 Claims, 5 Drawing Sheets

BATTERY FUEL GAUGE CIRCUIT

BACKGROUND OF THE INVENTION

1. Field of the Invention

The present invention relates to a battery fuel gauge circuit.

2. Description of the Related Art

Various kinds of battery-driven electronic devices such as cellular phone terminals, digital still cameras, PDAs (Personal Digital Assistants), laptop personal computers, etc., each include electronic circuits such as a CPU (Central Processing Unit) and a DSP (Digital Signal Processor), which are each configured to perform digital signal processing, a liquid crystal panel, other kinds of analog circuits and digital circuits, and so forth. Such electronic circuits are configured to operate receiving an electric power supply from a battery.

Such an electronic device has a function of detecting the remaining battery charge by measuring a current (which will be referred to as the "battery current" hereafter) supplied from the battery to a load, and by integrating the current values thus measured. Such a function is provided by a battery fuel gauge circuit, which is also referred as the "coulomb counter".

Description will be made below regarding the detection of the remaining battery charge for an electronic device such as a cellular phone terminal and so forth having a communication function. FIG. 1 is a diagram which shows an example of the waveform of the battery current $I_{BAT}$ in a standby state (sleep state) of a cellular phone terminal. It should be noted that the vertical axis and the horizontal axis shown in the waveform diagrams and the time charts in the present specification are expanded or reduced as appropriate for ease of understanding. Also, each waveform shown in the drawings is simplified for ease of understanding.

Such a cellular phone terminal is configured to periodically perform packet transmission (TX) and packet reception (RX) between itself and a base station for the purpose of location registration and so forth. In the transmission period $T_{TX}$, a large current flows through a transmission circuit including a power amplifier, a modulator, and a baseband IC (Integrated Circuit), leading to an increase in the battery current $I_{BAT}$. In this period, such a battery current $I_{BAT}$ changes dynamically according to the distance between the cellular phone terminal and the base station. Also, in the reception period $T_{RX}$, a receiving circuit, which includes a low-noise amplifier, a demodulator, a baseband IC, and so forth, is operated, leading to an increase in the battery current $I_{BAT}$. In contrast, in a period (non-communicating period) in which communication is not made in the standby state, almost all the internal circuit blocks of the cellular phone terminal are set to the standby state. In this state, the battery current $I_{BAT}$ becomes very small, and there is almost no change in the battery current $I_{BAT}$.

In order to integrate, with high precision, a burst current that flows intermittently during the transmission period $T_{TX}$ and the reception period $T_{RX}$, there is a need to increase the sampling frequency at which the battery current $I_{BAT}$ is to be sampled, so as to improve the resolution in the time-axis direction. However, such an increased sampling frequency leads to an increase in the power consumption of the battery fuel gauge circuit, which is undesirable.

SUMMARY OF THE INVENTION

The present invention has been made in order to solve such a problem. Accordingly, it is an exemplary purpose of an embodiment of the present invention to provide a battery fuel gauge circuit which requires very little power consumption to detect the remaining battery charge.

An embodiment of the present invention relates to a detection circuit configured to detect the remaining battery charge of a battery, and to be mounted on an electronic device comprising at least the battery, a processor configured to integrally control the electronic device, and a communication unit. The detection circuit comprises: an A/D converter configured to sample a magnitude of a current discharged from the battery, and to convert a magnitude of the current thus sampled into a digital current value; an interface circuit configured to receive, from the processor, control data which indicates a period in which there is an increase in current discharged from the battery; and a control unit configured to raise the sampling frequency of the A/D converter based upon control data in the period in which there is an increase in the current.

The processor has information with respect to the timing when each block mounted on the electronic device operates, i.e., the timing at which the battery current changes. Thus, by supplying, to the detection circuit, a control signal which indicates that there will be an increase in the current before a sharp increase occurs in the battery current, such an arrangement allows the detection circuit to sample such a sharp change in the current with an increased sampling frequency. Thus, such an arrangement provides improved detection precision. Furthermore, during a period in which the battery current stably exhibits a small value, the sampling operation is performed at a low sampling frequency, thereby suppressing an increase in power consumption.

Also, a detection circuit according to an embodiment may further comprise: a detection resistor arranged on a path of a current of the battery; and an amplifier configured to amplify a voltage drop across the detection resistor. The control unit may be configured to raise the operation speed of the amplifier in the period in which there is an increase in the current.

In order to follow such a sharp change in the battery current, the amplifier is required to operate at a response speed that is increased to some extent. In order to raise the operation speed of the amplifier, there is a need to increase the operation current of the amplifier. With such an embodiment, such an arrangement requires the operation current to be increased only in the period in which the high-speed operation is to be performed. Thus, such an arrangement is capable of suppressing an increase in the total power consumption.

With an embodiment, the A/D converter may be configured as a delta-sigma A/D converter. Also, the control unit may be configured to raise, based upon the control data, the frequency of a clock signal for the A/D converter in the period in which there is an increase in the current.

Also, a detection circuit according to an embodiment may further comprise an integrator circuit configured to integrate the current value acquired by the A/D converter.

By providing the detection circuit with a function of integrating the current value and holding the integrated current value, such an arrangement does not require the processor to read out the current value with each sampling operation of the A/D converter. Thus, such an arrangement provides a reduced amount of calculation and a reduction in the number of times data transmission/reception is performed between the processor and the detection circuit, thereby providing reduced power consumption.

Another embodiment of an embodiment of the present invention relates to an electronic device. The electronic device having such a communication function comprises: a battery; a processor; and a detection circuit according to any one of the aforementioned embodiments, configured to detect the remaining battery charge of the battery.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not substantially affect the electric connection therebetween, or that does not damage the functions or effects of the connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not substantially affect the electric connection therebetween, or that does not damage the functions or effects of the connection therebetween, in addition to a state in which the member A is directly connected to the member C, or the member B is directly connected to the member C.

In the present specification, the symbols that denote voltage signals, current signals, and resistors, also represent the respective voltage values, current values, and resistance values, as necessary.

Figure 2:
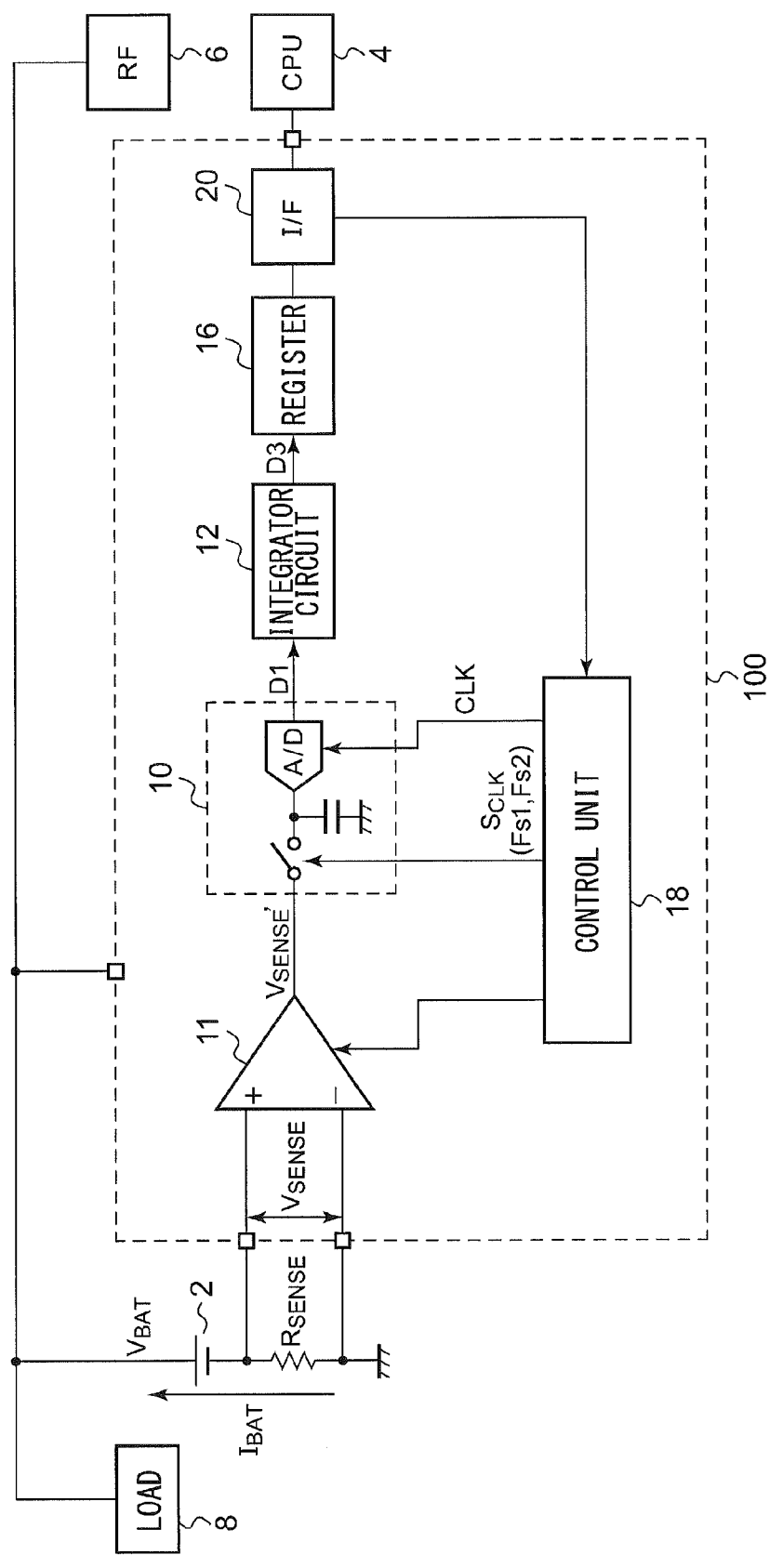
FIG. 2 is a block diagram which shows a configuration of an electronic device including a battery fuel gauge circuit according to an embodiment.

FIG. 2 is a block diagram which shows a configuration of an electronic device 1 including a battery fuel gauge circuit 100 according to an embodiment.

The electronic device 1 includes a battery 2, a CPU 4, a communication unit 6, and a load 8 that differs from the aforementioned circuit components, and a battery fuel gauge circuit (which will also be referred to simply as the "detection circuit" hereafter) 100. The electronic device 1 is configured as a cellular phone terminal, and has a function of communicating with a base station.

The battery 2 is configured as a power supply for the electronic device 1. For example, the battery 2 is configured as a secondary battery such as a lithium-ion battery, a nickel hydride battery, or the like, and is configured to output a battery voltage $V_{BAT}$, and to supply the battery voltage $V_{BAT}$ to the CPU 4, the communication unit 6, the load 8, and the detection circuit 100, which each function as a load.

The CPU 4 is a unit configured to integrally control the overall operation of the electronic device 1. Each function block mounted in the electronic device 1 operates according to an instruction received from the CPU 4. The CPU 4 may be configured as a baseband circuit. The communication unit 6 is a block configured to communicate with a base station, and includes a modulation circuit configured to modulate a baseband signal received from a baseband circuit, a power amplifier configured to amplify a transmission signal, an antenna configured to transmit a signal output from the power amplifier to a base station, an LNA (low-noise amplifier) configured to amplify a signal received from a base station via the antenna, a demodulation circuit configured to demodulate an output signal of the LNA, and so forth. The configuration and the communication method of the communication unit 6 are not restricted in particular.

Examples of the load 8 include: a power supply circuit such as a switching regulator, a linear regulator (LDO: Low Drop Output), a charge pump circuit, or the like; a charging circuit for the battery 2; a DSP (Digital Signal Processor); a liquid crystal panel; and other kinds of analog circuits and digital circuits.

The battery fuel gauge circuit 100, which is also referred to as the "coulomb counter", is configured to detect the battery current $I_{BAT}$ output from the battery 2, and to detect the remaining battery charge of the battery 2 in cooperation with the CPU 4. The detection circuit 100 includes an amplifier 11, an A/D converter 10, an integrator circuit 12, a register 16, a control unit 18, and an interface circuit 20. The detection circuit 100 may be integrated as a single IC together with unshown circuits such as a charging circuit, a control circuit for a DC/DC converter, a linear regulator (LDO: Low Drop Output), and a GPIO (General Purpose Input/Output). Such an IC is also referred to as the "power management IC".

A detection resistor $R_{SENSE}$ is arranged on a path of the battery current $I_{BAT}$ output from the battery 2. The detection resistor $R_{SENSE}$ may be arranged on the ground terminal side as shown in the drawing. Also, the detection resistor $R_{SENSE}$ may be arranged on the load side of the battery 2. A voltage drop (which will also be referred to as the "detection voltage") $V_{SENSE}$, which is proportional to the battery current $I_{BAT}$, occurs across the detection resistor $R_{SENSE}$.

The amplifier 11 is configured to amplify the detection voltage $V_{SENSE}$. The amplifier 11 is configured to be capable of changing its operation speed as described later. The A/D converter 10 is configured to sample a detection voltage $V_{SENSE}'$ thus amplified, and to convert the detection voltage $V_{SENSE}'$ thus sampled into a digital current value D that corresponds to the detection voltage $V_{SENSE}'$. The digital current value D1 is proportional to the battery current $I_{BAT}$.

The A/D converter 10 is configured to sample the detection voltage $V_{SENSE}'$ according to a sampling clock $S_{CLK}$ received from the control unit 18. The A/D converter 10 is configured to operate at a variable sampling frequency Fs, and to generate the digital current value D1 that corresponds to the detection voltage $V_{SENSE}$ for each sampling period Ts (=1/Fs). The discharge amount of the battery 2 is calculated by time integration of the battery current $I_{BAT}$. That is to say, the discharge amount of the battery 2 can be calculated by integrating the current value D1.

The A/D converter 10 may be configured as a delta-sigma A/D converter. With such an arrangement, when the sampling frequency Fs is high, the frequency of the operation clock CLK to be supplied to the delta-sigma A/D converter 10 is increased according to an increase in the sampling frequency Fs.

Figure 1:
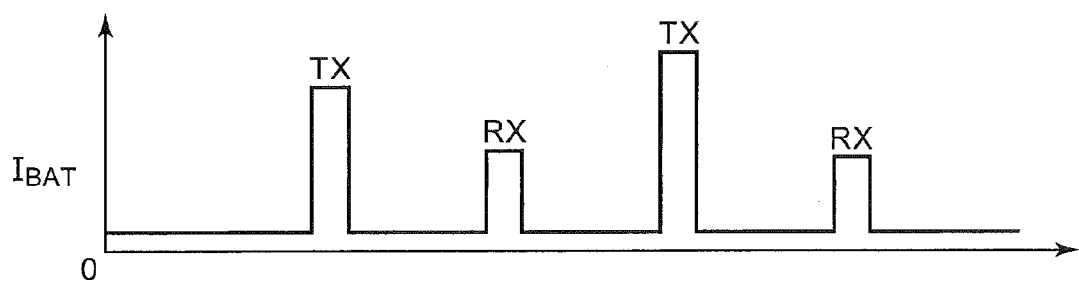
FIG. 1 is a diagram which shows an example of the waveform of the battery current in the standby state (sleep state) of a cellular phone terminal.

The control unit 18 is configured to set the sampling frequency Fs of the A/D converter 10. When the electronic device 1 is in the standby state (which will also be referred to as the "sleep state"), the battery current $I_{BAT}$ is very small, except in a period (which will be referred to as the "communicating period") in which the communication unit 6 communicates with a base station, as shown in FIG. 1. The communicating periods $T_{TX}$ and $T_{RX}$ each have a length on the order of several milliseconds to tens of milliseconds, for example. Between the communicating periods $T_{TX}$ and $T_{RX}$, there is a non-communicating period on the order of hundreds of milliseconds to several seconds.

As described above, in the non-communicating period, each block of the electronic device 1 enters the sleep state, except for blocks that are necessary even in this state. In this state, the battery current $I_{BAT}$ becomes very small, and there is very little fluctuation in the battery current $I_{BAT}$. Thus, in the non-communicating period, the control unit 18 instructs the A/D converter 10 to operate at a first sampling frequency Fs1 that is a relatively low sampling frequency.

On the other hand, in the communicating period, the control unit 18 instructs the A/D converter 10 to operate at a second sampling frequency Fs2 that is higher than the first sampling frequency Fs1. The current consumption required to operate the detection circuit 100 at the first sampling frequency Fs1 is sufficiently smaller than the current consumption required to operate the A/D converter 10 at the second sampling frequency Fs2. That is to say, the current consumption required for the detection circuit 100 changes according to the sampling frequency Fs. There is a tradeoff relation between the sampling frequency Fs and the current consumption.

Figure 3:
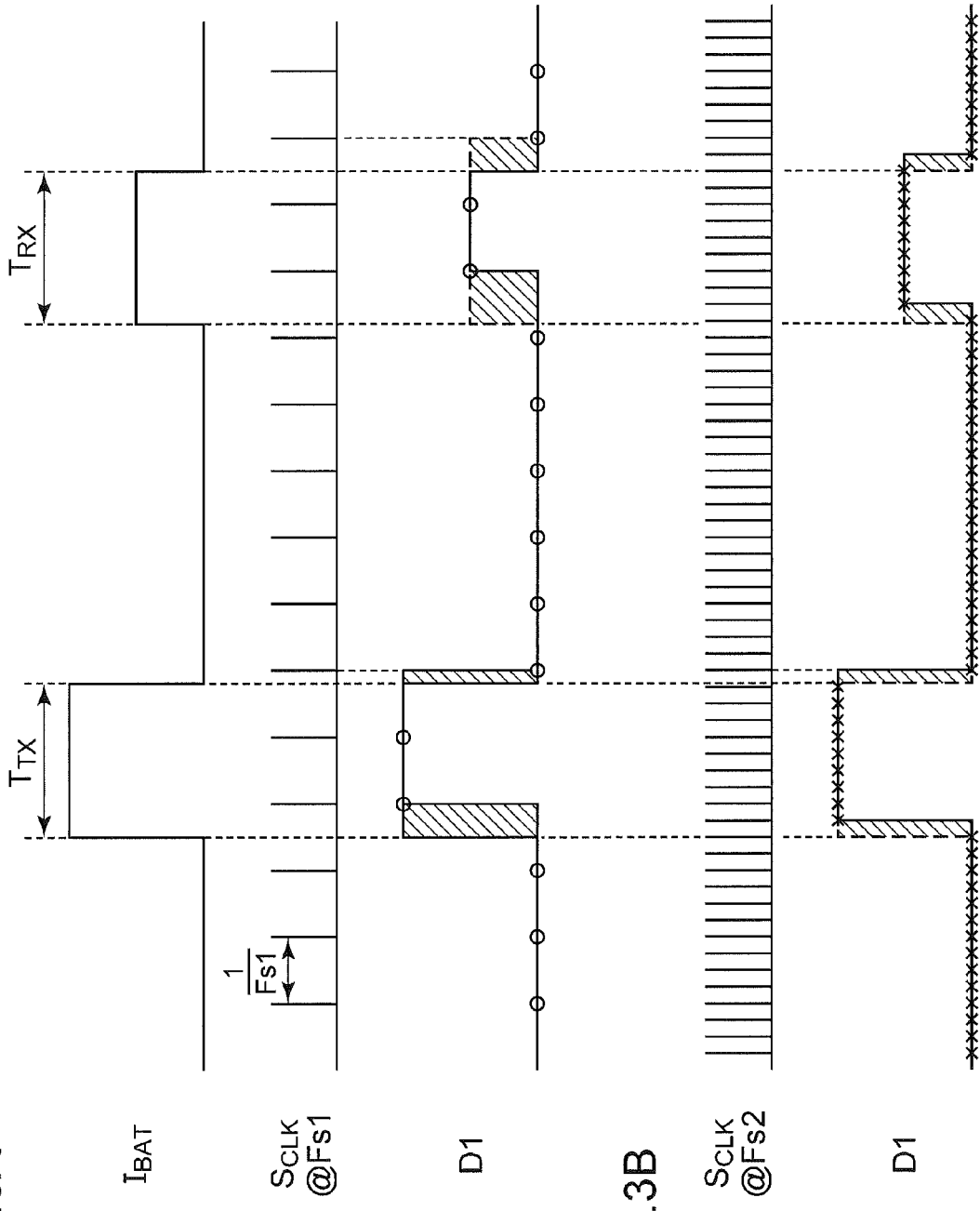
FIG. 3A is a diagram which shows the operation when the battery current in the standby state is sampled at a first sampling frequency.
FIG. 3B is a diagram which shows the operation when the battery current in the standby state is sampled at a second sampling frequency.

FIG. 3A is a diagram which shows the operation when the battery current $I_{BAT}$ in the standby state is sampled at the first sampling frequency. FIG. 3B is a diagram which shows the operation when the battery current $I_{BAT}$ in the standby state is sampled at the second sampling frequency.

As shown in FIG. 3A, when the sampling operation is performed at the first sampling frequency Fs1, the sampling period (1/Fs1) is not sufficiently shorter than the communicating period $T_{TX}$ or $T_{RX}$. Accordingly, such an arrangement leads to detection error, as indicated by the hatched area in the drawing.

Description will be made regarding the operation shown in FIG. 3B, with the waveform of the battery current $I_{BAT}$ shown in FIG. 3A being referred to and not shown in FIG. 3B. As shown in FIG. 3B, when the sampling operation is performed at the second sampling frequency Fs2, the hatched area becomes small, which means that detection error becomes small. However, in this state, the current consumption required for the detection circuit 100 far exceeds the current value that is allowable in the standby state.

In order to solve such a problem, based upon the current value D1 that corresponds to the battery current $I_{BAT}$, the control unit 18 judges whether or not the electronic device is in the non-communicating state or in the communicating state. Specifically, when the current value D1 is within a predetermined range based upon which the electronic device 1 is assumed to be in the standby state and in the non-communicating state, the detection circuit 100 instructs the A/D converter 10 to operate at the first sampling frequency Fs1. On the other hand, when the current value D1 that corresponds to the battery voltage $I_{BAT}$ increases and falls outside the predetermined range, the detection circuit 100 instructs the A/D converter 10 to operate at the second sampling frequency Fs2.

The detection circuit 100 and the CPU 4 are connected to each other via an I²C (Inter IC) bus or the like. Various kinds of data are transmitted and received between the interface circuit 20 and the CPU 4. The CPU 4 has the information with respect to the period of time in which the communication unit 6 performs communication, or with respect to the period of time in which the other loads operate, i.e., the information with respect to the period of time in which there will be an increase in the battery current $I_{BAT}$. Before an increase in the current, the CPU 4 transmits, to the interface circuit 20 of the detection circuit 100, the control data (load signal) D6 which indicates the period in which there will be an increase in the current.

Based upon the control data D6, the control unit 18 raises the sampling frequency Fs of the A/D converter 10 in the period in which there is an increase in the current, as compared with the sampling frequency set in the other periods. Furthermore, in the period in which there is an increase in the current, the control unit 18 raises the operation speed of the amplifier 11. The operation speed of the amplifier can be raised by raising its bias current. That is to say, there is a tradeoff relation between the operation speed of the amplifier and its operation current. Here, the bias current may represent a bias current (which will also be referred to as the "tail current") of a differential amplifier configured as an input stage of the amplifier 11, a bias current of its amplification stage (intermediate stage), or otherwise a bias current of its output stage (final stage).

The current value D1 acquired by the A/D converter 10 may be transmitted to the CPU 4 with each sampling. However, such an arrangement involves data transmission between the interface circuit 20 and the CPU 4 with each sampling. This requires the CPU 4 to integrate (accumulate) the current value D1 with each sampling. Accordingly, the CPU 4 must start up and perform calculation in order to integrate the current value D1 even in the standby state of the CPU 4 when the system is in the standby state and in the non-communicating state, leading to increased power consumption of the overall operation of the system. In order to solve such a problem, the detection circuit 100 according to the embodiment has the following features.

The integrator circuit 12 is configured to integrate the current value D1 acquired by the A/D converter 10. The integrated value D3 corresponds to the integration value of the battery current $I_{BAT}$, i.e., represents the charge amount discharged from the battery 2. The integrated value D3 is written to the register 16.

In the charging state of the battery 2, the voltage drop $V_{SENSE}$ across the detection resistor $R_{SENSE}$ in proportion to the charging current, with the opposite polarity of that which occurs when the discharge current flows. Thus, in the charging state, the current value D1 acquired by the A/D converter 10 represents the charging current. In the charging state, the integrated value D3 generated by the integrator circuit 12 represents the charge amount supplied to the battery 2 in the charging operation.

The interface circuit 20 does not transmit the integrated value D3 to the CPU 4 with each sampling, but at a rate that is lower than the sampling rate. Such an arrangement provides a reduction in the number of times data is transmitted, thereby providing reduced power consumption.

Such data transmission may be performed according to a request received from the CPU 4.

More preferably, the interface circuit 20 does not supply the integrated value D3 and the count value D4 to the CPU 4 in the standby state, but in the period in which the CPU 4 operates, and, more specifically, in the communicating periods $T_{TX}$ and $T_{RX}$. With such an arrangement, there is no need to restart the CPU 4 in the standby state only to transmit the integrated value D3 and the count value D4, thereby providing reduced power consumption.

The CPU 4 is configured to calculate the charge amount discharged from the battery 2 based upon the integrated value D3. The CPU 4 has information with respect to the sampling frequency Fs of the A/D converter 10 and the number of times the sampling is performed. With the number of times sampling is performed as n, with the integrated value D3 as m, and with the sampling frequency as Fs, the discharged charge amount $Q_{DIS}$ is represented by $Q_{DIS}=m \times n \times 1/Fs$. The CPU 4 calculates the discharged charge amount $Q_{DIS}$ every time it receives the integrated value D3 from the detection circuit 100, and adds the discharged charge amount $Q_{DIS}$ thus calculated to the discharged charge amount $Q_{DIS}$ integrated with every data transmission.

Figure 4:
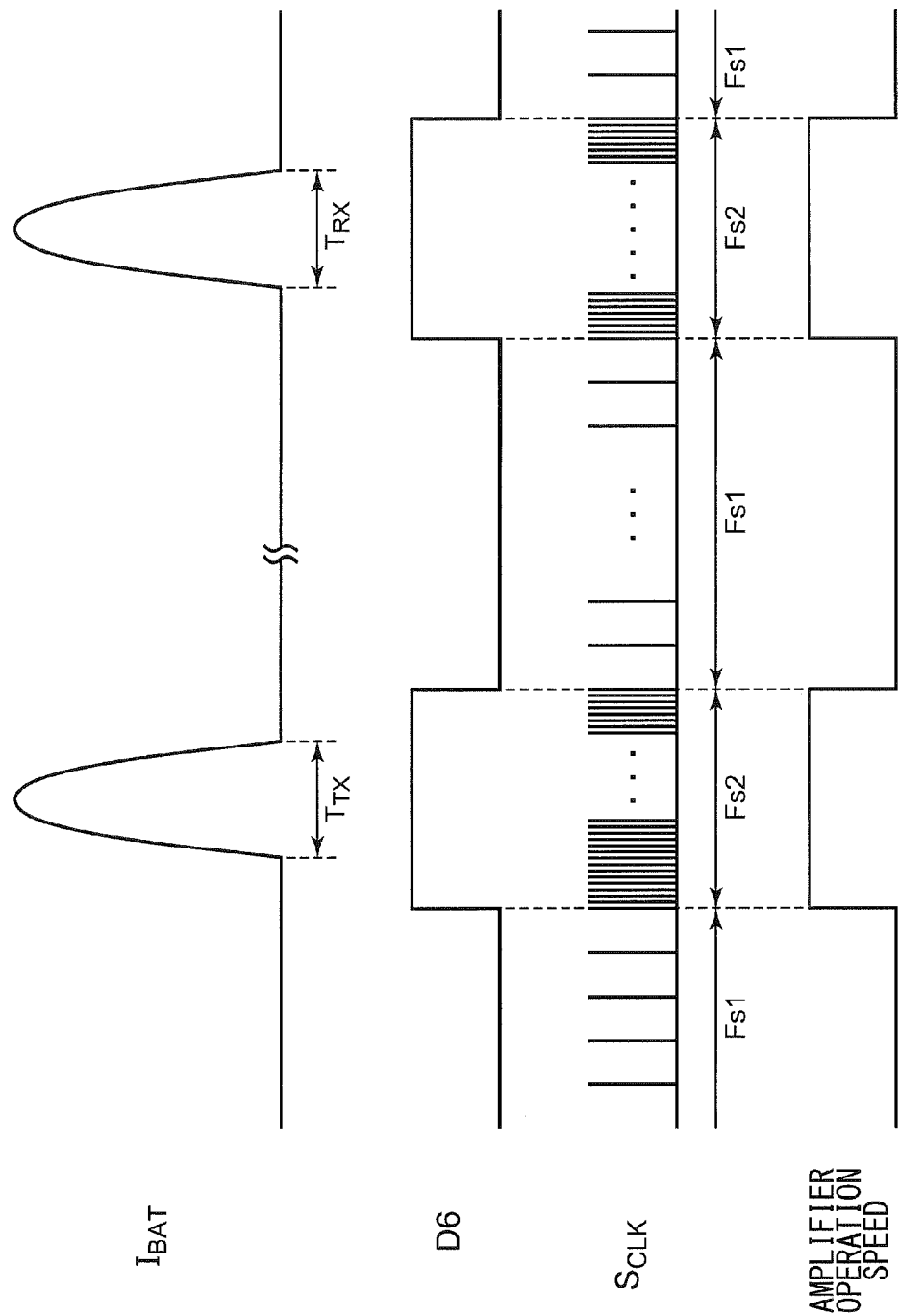
FIG. 4 is a waveform diagram which shows the operation of the detection circuit shown in FIG. 2.

The above is the configuration of the detection circuit 100. Next, description will be made regarding the operation thereof. FIG. 4 is a waveform diagram which shows the operation of the detection circuit 100 shown in FIG. 2.

In the period in which the battery current $I_{BAT}$ mostly does not flow, there is almost no fluctuation in the battery current $I_{BAT}$, or otherwise there is a very little fluctuation in the battery current $I_{BAT}$. Thus, in this period, the sampling frequency of the A/D converter 10 is set to a low value, and the response speed of the amplifier 11 is set to a low value.

Before the transmission period $T_{TX}$ or the reception period $T_{RX}$ in which data is transmitted/received between the communication unit 6 and the base station, when the control data D6 is asserted (set to high level), the control unit 18 switches the sampling frequency of the A/D converter 10 to the second sampling frequency Fs2. Furthermore, the bias current of the amplifier 11 is raised so as to raise the operation speed of the amplifier 11.

After the communicating period $T_{TX}$ or $T_{Rx}$ ends, the control data D6 is negated (set to low level). Upon receiving the control data D6 thus negated, the control unit 18 reduces the sampling frequency of the A/D converter 10, and reduces the operation speed of the amplifier 11.

The above is the operation of the detection circuit 100.

With the detection circuit 100, such an arrangement is capable of dynamically changing the sampling frequency Fs and the operation speed of the amplifier 11 according to the battery current $I_{BAT}$ according to the control operation of the CPU 4. Thus, such an arrangement provides the advantages of both high-precision detection and low current consumption.

Furthermore, by providing the detection circuit 100 with a function of integrating the current value D1, such an arrangement does not require data transmission between the detection circuit 100 and the CPU 4 with each sampling, thereby providing reduced power consumption of the overall operation of the system.

Moreover, by transmitting the integrated value D3 and the count value D4 acquired by the detection circuit 100 to the CPU 4 that is assumed to be in the operating state rather than in the standby state, such an arrangement prevents unnecessary restarting of the CPU 4, thereby providing reduced power consumption of the system.

Figure 5:
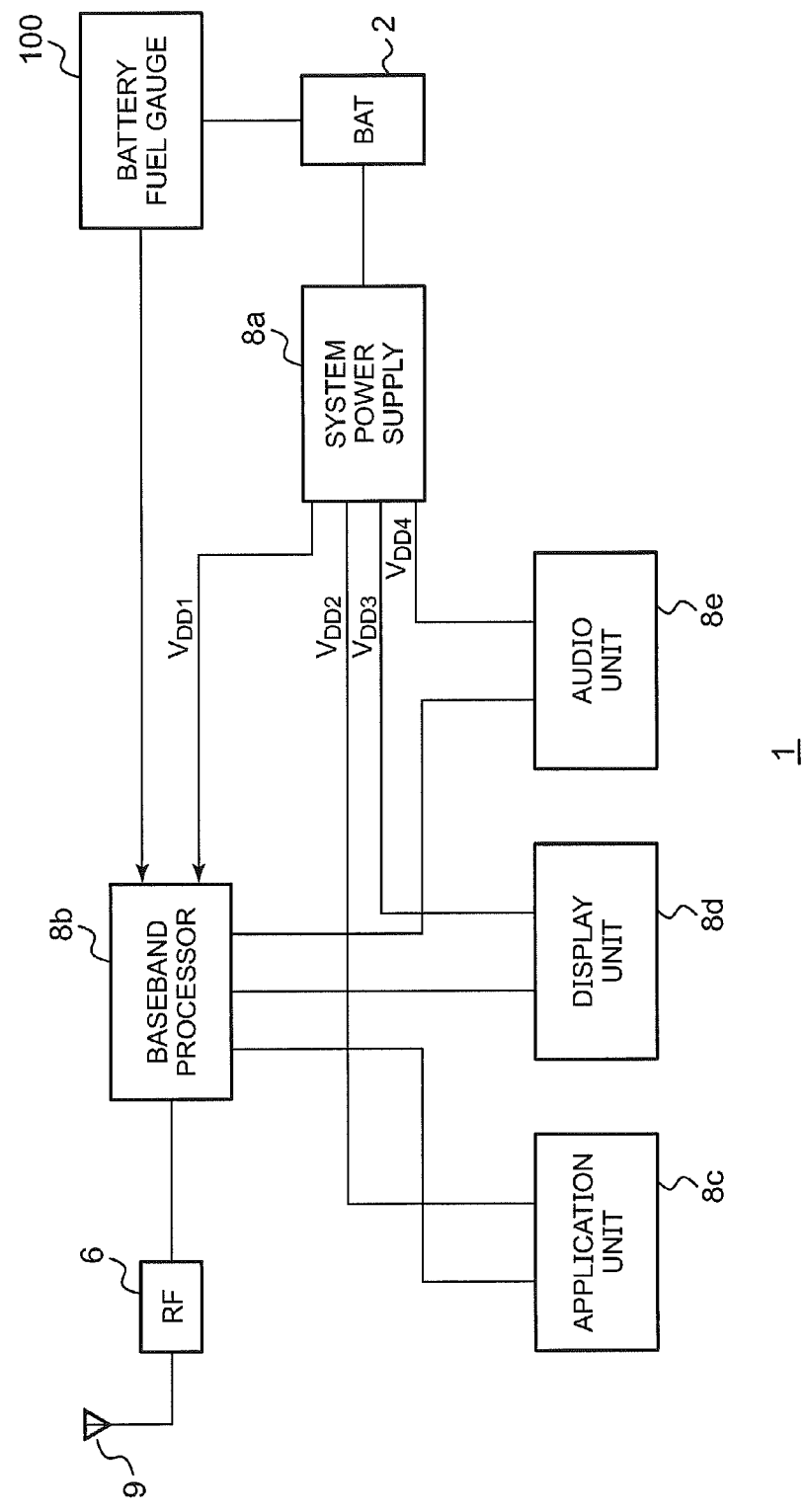
FIG. 5 is a block diagram which shows another configuration of an electronic device 1 including a battery fuel gauge circuit 100 according to an embodiment.

FIG. 5 is a block diagram which shows another configuration of an electronic device 1 including a battery fuel gauge circuit 100 according to an embodiment. The electronic device 1 is configured as a cellular phone terminal, for example. A system power supply 8a, a baseband processor 8b, an application unit 8c, a display unit 8d, and an audio unit 8e, shown in FIG. 5, correspond to the load 8 shown in FIG. 2.

The system power supply 8a is configured to receive the battery voltage $V_{BAT}$ from the battery 2, to step up or otherwise step down the battery voltage $V_{BAT}$ thus received so as to generate DC voltages $V_{DD1}$ through $V_{DD4}$, and to supply the DC voltages thus generated to the respective circuit blocks 8b through 8e of the electronic device 1.

The baseband processor 8b is a CPU (Central Processing Unit) configured to integrally control the overall operation of the electronic device 1. The baseband processor 8b is configured to control the communication unit 6, the application unit 8c, the display unit 8d, and the audio unit 8e.

The communication unit 6 includes a modulator that is compatible with a communication protocol such as CDMA, OFDM, or the like, a demodulator, a power amplifier, a low-noise amplifier, and so forth. The communication unit 6 is configured to receive a baseband signal from the baseband processor 8b, to modulate and amplify the baseband signal thus received, and to transmit the modulated and amplified signal via an antenna 9. Furthermore, the communication unit 6 is configured to amplify and demodulate a high-frequency signal received via the antenna 9, and to output the digital baseband signal thus amplified and demodulated to the baseband processor 8b.

The application unit 8c includes a transmission/reception circuit for infrared communication, wireless LAN (Local Area Network), etc., an audio DSP, and so forth. The display unit 8d includes a display panel, a driver, a backlight LED, a touch panel controller, and so forth. The audio unit 8e includes an audio digital/analog converter, an audio codec, a headphone amplifier, a speaker amplifier, and so forth.

The detection circuit 100 is configured to detect the remaining battery charge of the battery 2. The baseband processor 8b is notified of the detection result. The baseband processor 8b is configured to control the application unit 8c, the display unit 8d, the audio unit 8e, and so forth, according to the remaining battery charge thus received as a notice. For example, the baseband processor 8b is configured to display, on a display panel of the display unit 8d, the information which indicates the remaining battery charge of the battery 2. Alternatively, the baseband processor 8b is configured to instruct the audio unit 8e to generate an audio signal according to the remaining battery charge of the battery 2.

While the preferred embodiments of the present invention have been described using specific terms, such description is for illustrative purposes only, and it is to be understood that changes and variations may be made without departing from the spirit or scope of the appended claims.

What is claimed is:

1. A detection circuit configured to detect a remaining battery charge of a battery, and to be mounted on an electronic device comprising at least the battery, a processor configured to integrally control the electronic device, and a communication unit, the detection circuit comprising:

an A/D converter configured to sample a magnitude of a current discharged from the battery, and to convert a magnitude of the current thus sampled into a digital current value;

an interface circuit configured to receive, from the processor, control data which indicates a period in which there is an increase in current discharged from the battery;

a control unit configured to raise a sampling frequency of the A/D converter based upon control data in the period in which there is an increase in the current; and an integrator circuit configured to integrate the current value acquired by the A/D converter so as to generate an integrated value and output the integrated value to the interface circuit, wherein the control unit judges whether the electronic device is in a non-communicating state or in a communicating state based upon the current value that corresponds to the battery current, and the interface circuit supplies the integrated value to the processor only while in the communicating state; and wherein the communicating state is a transmit period or receive period of the electronic device.

2. The detection circuit according to claim 1, further comprising:

a detection resistor arranged on a path of a current of the battery; and an amplifier configured to amplify a voltage drop across the detection resistor, wherein the control unit is configured to raise the operation speed of the amplifier in the period in which there is an increase in the current.

3. The detection circuit according to claim 2, wherein the control unit is configured to raise the operation speed of the amplifier by raising a bias current of the amplifier.

4. The detection circuit according to claim 1, wherein the A/D converter is configured as a delta-sigma A/D converter, and wherein the control unit is configured to raise, based upon the control data, a frequency of a clock signal for the A/D converter in the period in which there is an increase in the current.

5. A detection circuit configured to detect the remaining battery charge of a battery, and to be mounted on an electronic device comprising at least the battery, a processor configured to integrally control the electronic device, and a communication unit, the detection circuit comprising:

an amplifier configured to be capable of changing its operation speed, and to amplify a detection voltage that corresponds to a current discharged from the battery;

an A/D converter configured to sample an output signal of the amplifier, and to convert the output signal thus sampled into a digital current value;

an interface circuit configured to receive, from the processor, control data which indicates a period in which there is an increase in current discharged from the battery;

a control unit configured to raise the operation speed of the amplifier in the period in which there is an increase in the current; and an integrator circuit configured to integrate the current value acquired by the A/D converter so as to generate an integrated value and output the integrated value to the interface circuit, wherein the control unit judges whether the electronic device is in a non-communicating state or in a communicating state based upon the current value that corresponds to the battery current, and the interface circuit supplies the integrated value to the processor only while in the communicating state;

and wherein the communicating state is a transmit period or receive period of the electronic device.

6. The detection circuit according to claim 5, wherein the control unit is configured to raise the operation speed of the amplifier by raising a bias current of the amplifier.

7. An electronic device comprising:

a battery;

a processor; and a detection circuit according to claim 1, configured to detect the remaining battery charge of the battery.

8. A method for detecting the remaining battery charge of a battery that is mounted on an electronic device that comprises at least the battery, a processor configured to integrally control the electronic device, and a communication unit, the method comprising:

sampling a magnitude of a current discharged from the battery and converting a magnitude of the current thus sampled into a digital current value, which are performed by an A/D converter;

integrating the current value acquired by the A/D converter so as to generate an integrated value and outputting the integrated value, generating control data which indicates a period in which there is an increase in current discharged from the battery, which is performed by the processor;

raising, based upon the control data, a sampling frequency of the A/D converter in the period in which there is an increase in the current;

determining whether the electronic device is in a non-communicating state or in a communicating state based upon the current value that corresponds to the battery current; and supplying the integrated value to the processor only while in the communicating state;

wherein the communicating state is a transmit period or receive period of the electronic device.

9. A method for detecting the remaining battery charge of a battery that is mounted on an electronic device that comprises at least the battery, a processor configured to integrally control the electronic device, and a communication unit, the method comprising:

amplifying a detection voltage that corresponds to a current discharged from the battery, which is performed by the amplifier;

sampling an output signal of the amplifier and converting the output signal thus sampled into a digital current value;

integrating the current value acquired by the A/D converter so as to generate an integrated value and outputting the integrated value, generating control data which indicates a period in which there is an increase in current discharged from the battery, which is performed by the processor;

raising, based upon the control data, the operation speed of the amplifier in the period in which there is an increase in the current;

determining whether the electronic device is in a non-communicating state or in a communicating state based upon the current value that corresponds to the battery current; and supplying the integrated value to the processor only while in the communicating state;

wherein the communicating state is a transmit period or receive period of the electronic device.

* * * * *